United States Patent
Whatley

(10) Patent No.: US 6,844,054 B2
(45) Date of Patent: Jan. 18, 2005

(54) THERMAL MANAGEMENT MATERIAL, DEVICES AND METHODS THEREFOR

(75) Inventor: Bradford L. Whatley, Lakewood, CO (US)

(73) Assignee: Thermo Composite, LLC, Lakewood, CO (US)

( * ) Notice: Subject to any disclaimer, the term of this patent is extended or adjusted under 35 U.S.C. 154(b) by 0 days.

(21) Appl. No.: 10/137,442

(22) Filed: Apr. 30, 2002

(65) Prior Publication Data

US 2002/0182397 A1 Dec. 5, 2002

Related U.S. Application Data

(60) Provisional application No. 60/287,614, filed on Apr. 30, 2001.

(51) Int. Cl.[7] .............................................. B32B 25/02
(52) U.S. Cl. .................... 428/295.4; 428/929; 428/367; 428/364; 428/328; 428/323; 428/319.3; 428/301.4; 428/299.1; 428/298.1; 428/297.4; 428/296.7; 428/295.4; 428/295.1; 428/293.1; 60/531; 60/690; 60/692; 438/122; 438/125
(58) Field of Search ............................. 428/293.1, 323, 428/295.1, 328, 295.4, 364, 296.7, 367, 297.4, 929, 298.1, 299.1, 301.4, 319.4, 292.1; 438/692, 690; 60/675, 641, 531; 62/3.5, 371

(56) References Cited

U.S. PATENT DOCUMENTS

| 4,077,216 A |   | 3/1978 | Cooke-Yarborough |
|---|---|---|---|
| 4,125,122 A |   | 11/1978 | Stachurski |
| 4,143,517 A | * | 3/1979 | Compton ..................... 60/675 |
| 6,308,518 B1 | * | 10/2001 | Hunter ......................... 62/3.3 |

* cited by examiner

*Primary Examiner*—Merrick Dixon
(74) *Attorney, Agent, or Firm*—Timothy J. Martn; Michael R. Henson; Rebecca A. Gegick

(57) ABSTRACT

The present invention provides thermal devices, materials and methods for use in transferring heat from heat sources. One embodiment comprises a thermal transfer body that has first and second end portions and includes a thermally anisotropic material that conducts more thermal energy in a longitudinal direction than in a direction transverse thereto, wherein at least one of the first and second end portions includes a projection having a surface area oriented obliquely to the longitudinal direction. Multiple projections may be provided of various geometries, such as pyramids, cones, triangular prismoids and domes. The thermally anisotropic material may include an ensemble of longitudinally thermally conductive fibers, such as carbon fibers derived from precursors such as petroleum or coal pitch, which may be embedded in a support matrix of various materials.

37 Claims, 6 Drawing Sheets

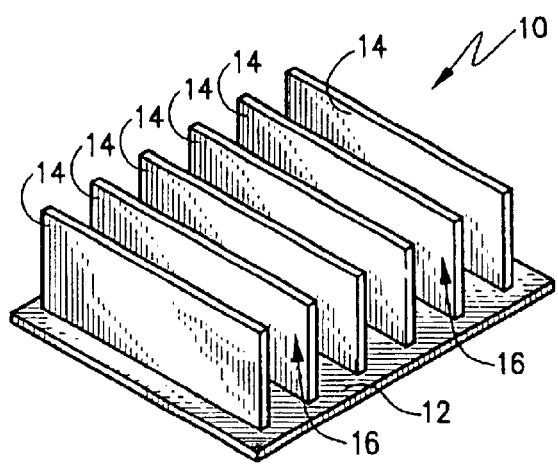
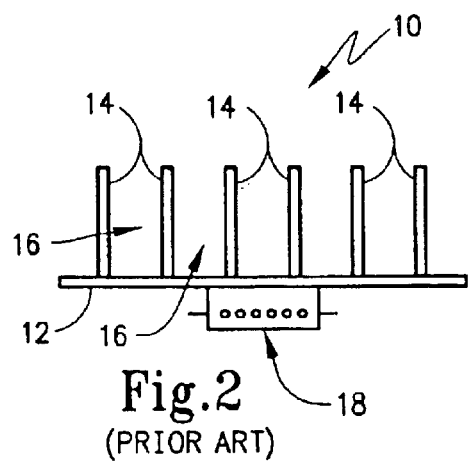
Fig.1
(PRIOR ART)
Fig.2
(PRIOR ART)
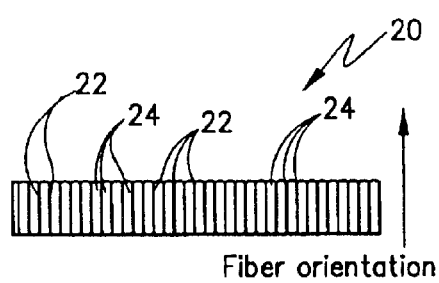
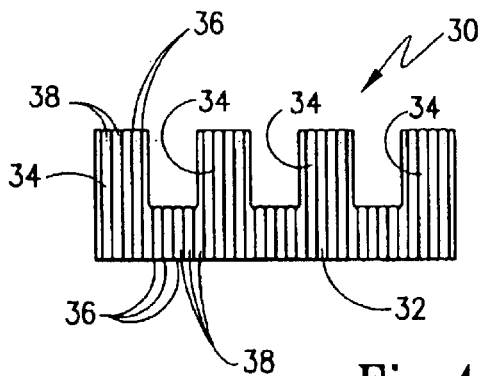
Fig.3
Fig.4
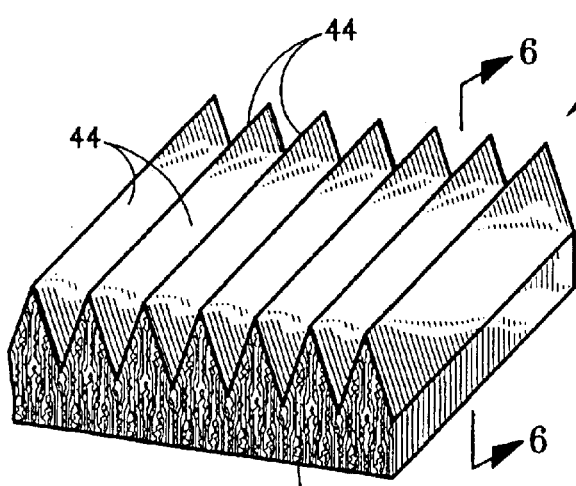
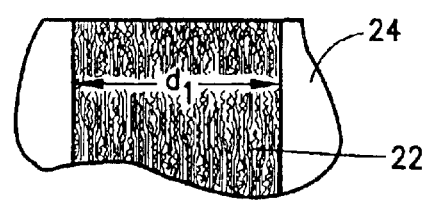
Fig.5
Fig.7

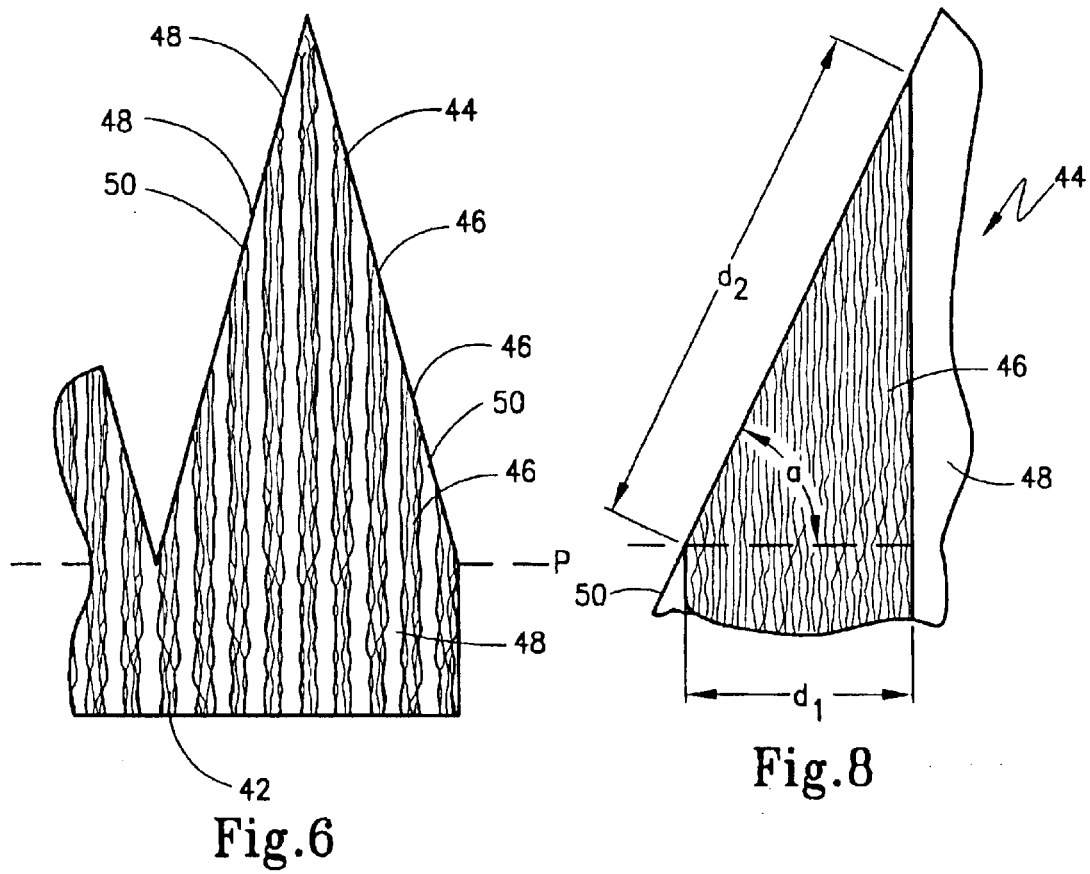
Fig.6
Fig.8
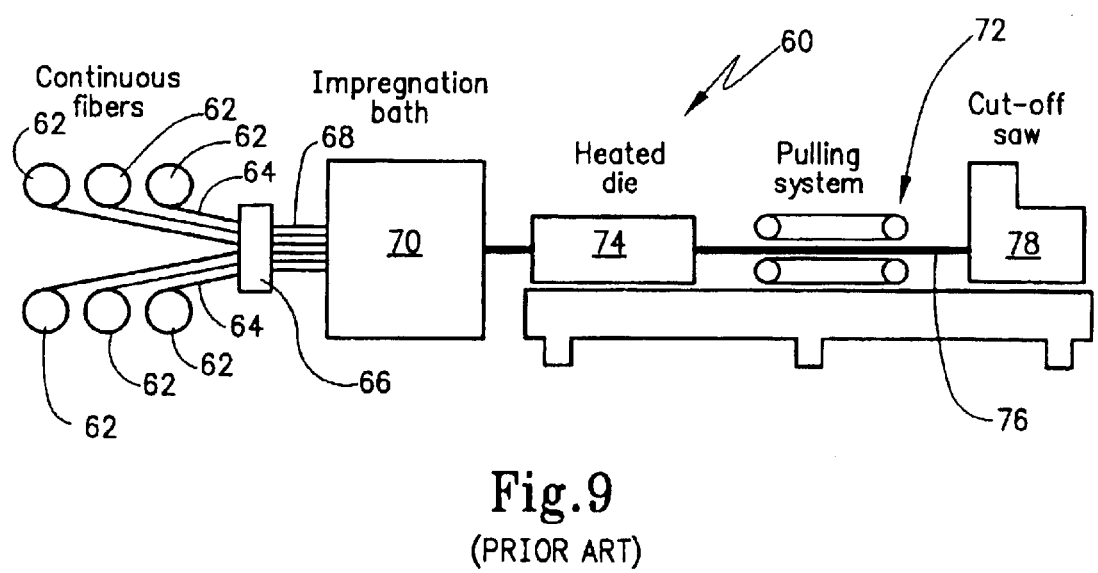
Fig.9
(PRIOR ART)

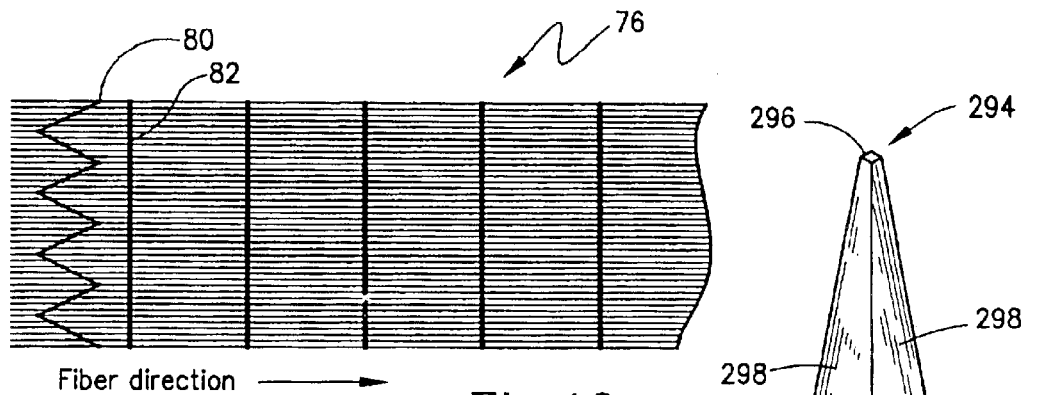
Fiber direction →
Fig. 10
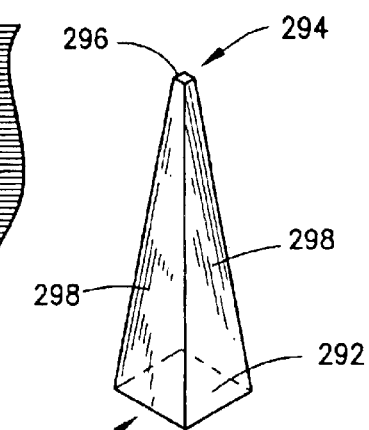
Fig. 12a
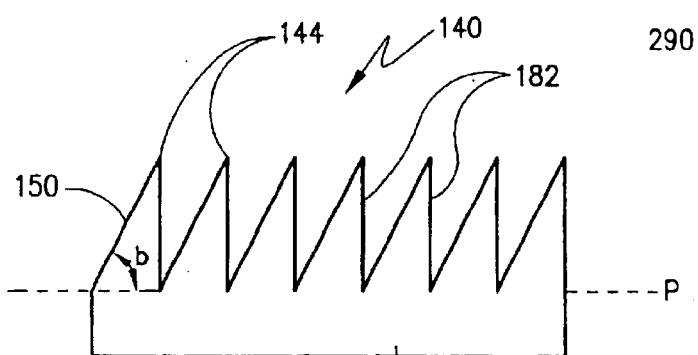
Fig. 11
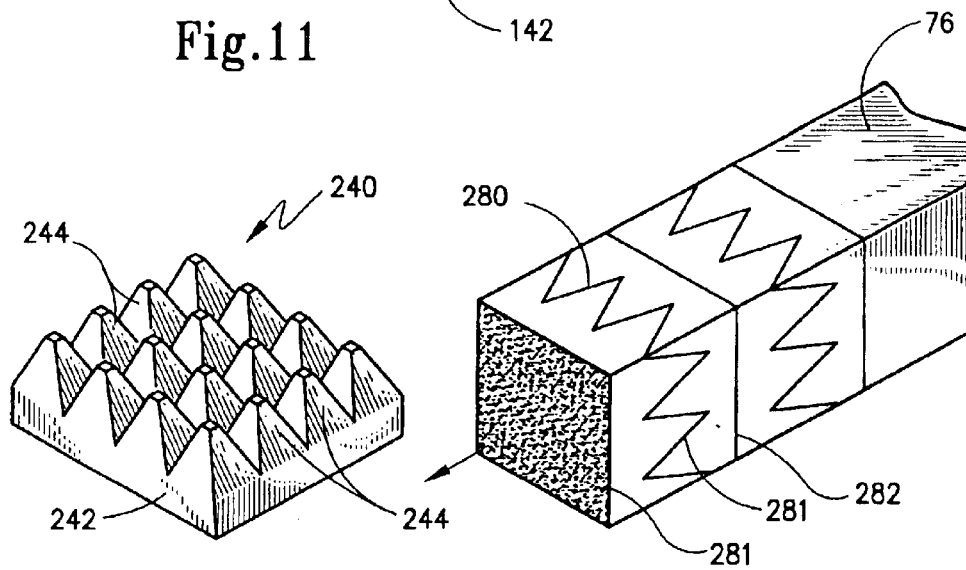
Fig. 12
Fig. 13

THERMAL MANAGEMENT MATERIAL, DEVICES AND METHODS THEREFOR

CROSS-REFERENCE TO RELATED APPLICATIONS

This application claims the benefit of U.S. Provisional Application No. 60/287,614, filed Apr. 30, 2001.

FIELD OF THE INVENTION

The present invention broadly relates to materials, devices and methods for transferring and/or managing heat between two objects or locations. More particularly, the present invention concerns the dissipation of heat from various objects. This invention is specifically directed to heat sink devices, materials and methods that are used to dissipate heat from electronic components, parts and equipment.

BACKGROUND OF THE INVENTION

One of the most remarkable fields of human invention and progress in the last century has been the development of the electronics industry, especially as applicable to communications and data processing. Electronic processing components progressed from vacuum tubes, to transistors to very large scale integrated circuits and the like. This evolution has lead to electronic devices that are both more powerful and more compact. Concomitant with the use of electronic devices is thermal energy created by those devices. Heat, arising from electrical power throughput in these devices acts as a limit upon their ability to perform. This is especially true in digital circuitry.

As a result of the generation of heat, there became a need for dissipating that heat into the external environment. Indeed, in high power applications, water cooling jackets and refrigeration units were used to exhaust excess heat from electronic equipment. However, such high capacitance cooling systems are not compatible with portable devices. Thus, as technology has developed smaller and more powerful electronic circuits that generate more heat in small space, the volume and weight allocated for structures used in thermal management has become a significant factor of the total system volume and weight. Thermal management requirements can thus impact on the performance, reliability, cost and system logistics.

Existing heat dissipation devices are typically in the form of heat sinks. These devices include a base plate in thermal communication with the heat-producing electrical component. A series of fins extend from the base plate so that heat produced by the component may be conducted by the metal throughout the structure. The fins are employed to increase the surface area so that the waste heat may be dissipated to the surrounding air. However, since air is essentially an insulator, there are some limitations on the spacings of the fins of the metal heat sinks as well as size and volume restrictions.

Accordingly, there is a need for new and improved materials, devices and methods for thermally dissipating heat, especially from electronic components. There is a further need for heat sinks of higher efficiency in conducting and dissipating heat. A need exists for heat sinks which have increased thermal dissipative ability in smaller volumes. There is also a need for heat sinks having reduced costs in production and use. The invention is directed to meeting these needs.

BRIEF SUMMARY OF THE INVENTION

It is an object of the present invention to provide new and useful materials, thermal management devices, such as heat sinks, and methods for producing the same.

It is another object of the present invention to provide new and useful thermal devices and methods for transferring thermal energy between two locations.

It is still another object of the present invention to provide materials and heat sinks that have increased thermal efficiency in dissipating heat.

A further object of the present invention is to provide materials and heat sinks, as well as methods for producing the same, wherein the heat sinks can be smaller in volume for a given heat dissipative capacity.

Still a further object of the present invention is to provide materials and heat sinks made therefrom which can be produced at reduced costs.

Yet another object of the present invention is to provide materials and heat sinks which eliminate the metal components in favor of a composite of materials.

According to the present invention, then, a thermal device is provided, comprising a thermal transfer body having first and second end portions, wherein the thermal transfer body includes a thermally anisotropic material that conducts more thermal energy in a longitudinal direction than in a direction transverse thereto, and wherein at least one of the first and second end portions includes a projection having a surface area oriented obliquely to the longitudinal direction. The thermal device may include a plurality of projections, which may be similarly shaped, and which generally extend in the longitudinal direction. Each projection may include a surface that extends in a plane oriented at an angle oblique to the longitudinal direction, such as an angle from about 40 to about 88 degrees. The projections may be generally triangular prismoidal shapes, generally pyramidal shapes, generally conical shapes or generally hemispherical shapes. The thermally anisotropic material may include an ensemble of longitudinally thermally conductive fibers, which may be contained within a support matrix.

The present invention also relates to a thermal device useful in transferring heat from a heat source, comprising a thermal transfer body that includes an ensemble of longitudinally thermally conductive fibers extending from a first end to a second end thereof, wherein the first end includes a thermal collector structure adapted to be placed in thermal communication with the heat source, wherein the second end includes a thermal dissipater structure adapted to dissipate heat therefrom, and wherein at least one of the thermal collector structure and the thermal dissipater structure includes exposed end surface regions of the fibers that are oriented obliquely to a longitudinal direction of the fibers. The longitudinally conductive fibers may be carbon fibers, such as ones derived from polyacrilonitrile, petroleum pitch, coal pitch, synthetic pitches and the like. The thermal transfer body may be formed of a material wherein said ensemble of longitudinally thermally conductive fibers is embedded in a support matrix, which may be thermally conductive or thermally insulating, such as polymers, including epoxy, rubber and plastic, binder pitch, aluminum and copper, and may further include an additive, such as graphite, aluminum or copper, embedded therein. The material may be at least sixty percent carbon.

The present invention further provides a thermal device useful in transferring heat from a heat source, comprising a thermal transfer body that includes an ensemble of longitudinally thermally conductive fibers extending from a first end to a second end thereof, wherein at least one of the first end and the second end includes at least one projection defined by a base portion of a first cross-section, a peak portion of a second cross-section smaller than the first cross-section, and at least one sidewall extending between the base portion and the peak portion. The first cross-section and second cross-section may each be a geometric shape selected from circular, oval and polygonal, and may be different geometric shapes or geometrically congruent. The first end or second end may include a plurality of projections, which may be aligned in a regular array thereof. The sidewall may extend in a plane oriented at an angle to a longitudinal direction of said fibers, with this angle being more than zero degrees and less than ninety degrees, i.e. "oblique" to the longitudinal direction, and may include exposed end surface regions of the fibers that are oriented obliquely to a longitudinal direction of the fibers.

The present invention also relates to a heat sink useful in dissipating heat from a heat source, comprising a thermal transfer body that includes an ensemble of longitudinally thermally conductive fibers extending from a first end to a second end thereof, and wherein the second end includes a thermal dissipater structure having end surface regions of at least some of the fibers exposed and oriented obliquely to a longitudinal direction of the fibers.

The present invention additionally relates to a thermal device useful in transferring heat from a heat source, comprising a support matrix formed of a bendable material, and an ensemble of longitudinally extending, thermally conductive fibers formed of an anisotropic material that conducts more thermal energy in the longitudinal direction than in a direction transverse thereto, the fibers being embedded in the support matrix, which may be flexible or thermoformable, and may be epoxy, binder pitch, rubber, plastic, aluminum or copper.

The present invention also relates to a thermal device useful in transferring heat from a heat source, comprising a thermal transfer body that includes an ensemble of longitudinally extending, thermally conductive fibers formed of an anisotropic material that conducts more thermal energy in the longitudinal direction than in a direction transverse thereto, the fibers being braided together. The thermal transfer body may be disposed within a thermally insulating sheath.

A thermal management device is also provided, comprising a composite body formed by an ensemble of longitudinally thermally conducting fibers embedded in a support matrix of a first material, the composite body having a base, and at least one projection extending longitudinally from the base with at least some of the fibers extending from the base in a longitudinal direction within the projection to terminate in end surfaces with at least some of the end surfaces oriented obliquely to the longitudinal direction.

A method is also provided of forming a thermal management device, comprising assembling a plurality of longitudinally thermally conducting fibers into a longitudinally extending ensemble that has a longitudinal axis; and cutting at least some of the fibers such that at least some of the fibers have end surface regions oriented obliquely to the longitudinal axis.

A method is provided of dissipating heat from a heat source, comprising providing a thermal transfer device having a thermal transfer body defined by a first end portion extending in a longitudinal direction to a second end portion thereof, wherein the thermal transfer body is formed of a thermally anisotropic material that conducts more thermal energy in the longitudinal direction than in a direction transverse thereto, and wherein at least one of the first end portion and the second end portion of the thermal transfer body includes at least one projection having a surface region oriented obliquely to the longitudinal direction; and contacting the heat source with one of the first end portion and second end portion of the thermal device thereby to dissipate heat from the heat source at the other of the first end portion and the second end portion.

Finally, the present invention relates to an electrical assembly, comprising at least one electrical component that produces heat during use; and a heat sink in thermal communication with the electrical component, the heat sink comprising a thermal transfer body that includes an ensemble of longitudinally thermally conductive fibers extending from a first end to a second end thereof, and wherein the second end of the thermal transfer body is formed as a thermal dissipater structure having end surface regions of at least some of the fibers exposed and oriented obliquely to a longitudinal direction of the fibers.

These and other objects of the present invention will become more readily appreciated and understood from a consideration of the following detailed description of the exemplary embodiments of the present invention when taken together with the accompanying drawings, in which:

BRIEF DESCRIPTION OF THE DRAWINGS

FIG. 1 is a perspective view of a metal heat sink according to the prior art;

FIG. 2 is a side view in elevation of the heat sink of FIG. 1 showing an electronic component associated therewith;

FIG. 3 is a side view in elevation of a cut piece of carbon fiber composite;

FIG. 4 is a side view in elevation of a piece of carbon fiber composite showing a fin construction;

FIG. 5 is a perspective view of a representative heat sink according to a first exemplary embodiment of the present invention;

FIG. 6 is a cross-sectional view taken about lines 6—6 of FIG. 5;

FIG. 7 is a diagrammatic view of a heat conductive fiber in a flat configuration heat sink shown in FIG. 3;

FIG. 8 is a diagrammatic view of a heat conductive fiber in the geometric configuration of the heat sink of FIGS. 5 and 6;

FIG. 9 is a diagrammatic view of a pultrusion system as is known in the prior art;

FIG. 10 is a diagrammatic view of a pultruded composite fiber block according to the present invention showing the cutting thereof to form the heat sink of FIG. 5;

FIG. 11 is a side view in elevation of an alternative geometry for a heat sink according to an alternative embodiment of the present invention;

FIG. 12 is a perspective view showing a second alternative embodiment of a heat sink according to the present invention;

FIG. 12(a) is a perspective view of a single projection of the heat sink of FIG. 12;

FIG. 13 is a perspective view of a pultruded block along with the cutting pattern therefore to produce the heat sink of FIG. 12;

DETAILED DESCRIPTION OF THE INVENTION

Figure 14:
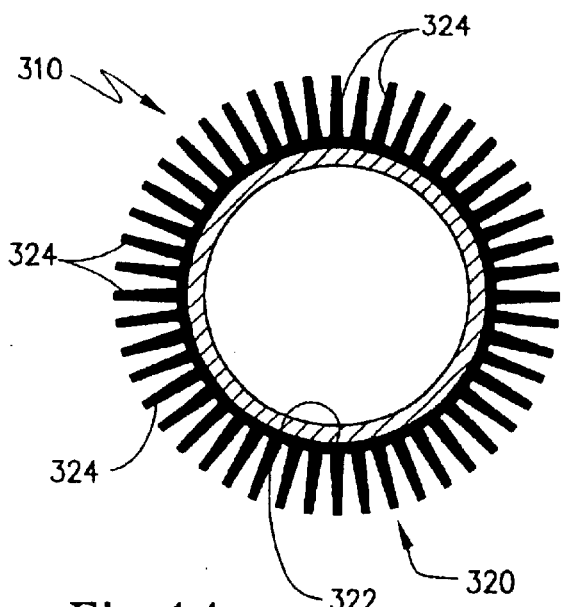
FIG. 14 is a cross-sectional view of a heat pipe employing the heat sink material of the present invention.

The present invention generally relates to materials and devices for thermal management as well as to methods of producing such materials and devices. The present invention specifically concerns heat sinks that have the ability to efficiently dissipate heat from electronic components such as computer processing units, microchips and the like. However, it should be understood that the present invention is not limited just to heat sinks for these applications. Indeed, the thermal management devices according to the present invention can be employed as heat sinks used with, for example, transformers, chokes, circuit boards, housing components, and other electronic equipment. Further, the concepts of the present invention can be employed in other heat sink or thermal applications in the non-electronic industries.

Broadly, the heat sinks according to the present invention employ a pultruded carbon fiber mass wherein a plurality of longitudinal carbon fibers are impregnated or embedded within a resin or other matrix. The resulting composite material is then cut into a selected geometry that enhances the thermal dissipative capacitance of the highly heat conductive carbon fiber filaments. Other materials that may now be know or that hereafter may be developed could be employed where the same exhibit comparable thermal transfer properties.

With reference to FIGS. 1 and 2, a heat sink 10 according to the prior art is illustrated. Here, heat sink 10 is formed of metal and includes a base plate 12 that is in the form of a flat rectangle. A plurality of fins 14 extend perpendicularly to base plate 12 and are formed integrally therewith. Fins 14 are oriented in parallel, spaced-apart relationship to one another so as to have open regions 16 disposed therebetween. As is shown in FIG. 2, for illustration purposes only, an electronic component 18 is secured to base plate 12 of heat sink 10 in thermal communication therewith. Heat generated by electrical component 18 is then conducted by base plate 12 and integral fins 14 so that it may be dissipated to the surrounding environment, which is normally air. Heat sink 10 relies significantly on the enlarged surface area provided by fins 14 both for radiation and convection dissipation of heat from electrical component 18. This is possible since metal is isotropic in its thermal transfer properties.

As is well known, the objective of all thermal management systems is the efficient removal of heat from the electronic heat source, such as electrical component 18, to the ambient or artificial cooling environment. Thermal management can be separated into three major phases: (1) the heat transfer processes within the electronic device; (2) the heat transfer from the device to a heat dissipater; and (3) heat transfer from the heat dissipater to the ambient or artificial cooling environment. The rate at which heat flows through a material is proportional to the area normal to the heat flow and to the temperature gradient along the flow path. For one-dimensional steady-state heat flow, this rate can be expressed by Fourier's Law:

$$k = (q/A) \times (d/\Delta T)$$

where:

| | |
|---|---|
| k = | thermal conductivity |
| q/A = | heat flux (watts per unit area) |
| d = | length of the heat flow path |
| $\Delta T$ = | temperature gradient |

Thermal conductivity, k, is an intrinsic property of a homogeneous material that describes the ability of that material to conduct heat. A higher value means that the material can conduct a greater heat flux for a given temperature gradient. Heat generated by an electronic device must be removed to the ambient environment to ensure the device's reliable operation, which requires a thermally conductive pathway to the dissipation point.

A major factor in the efficiency of any thermal management system is determined by the conductivity of material used in the thermal management system to acquire and transport waste thermal energy generated by heat generating components. The higher the conductivity of the material used as the medium to acquire and transport the waste thermal energy, then the more efficient the system becomes, provided the dissipation method can move the waste thermal energy efficiently away from the acquisition medium's surface at a rate equal to or faster than its acquisition.

Traditional metals with high thermal conductivity used for thermal management include silver, copper and aluminum. However, as demonstrated by the present invention, pure carbon in the form of pitch fiber offers significant improvements for thermal management. Pure carbon crystalline structure theoretically can exceed 2000+W/m-k in the longitudinal direction of its crystalline alignment and is used to produce a pitch based graphite fiber or filament which can be used as both a high strength reinforcement in advanced engineered material fabrication and as a high thermal conductive medium.

Metals are isotropic materials, having uniform properties in all directions. The measured properties of the isotropic material are independent of the axis of testing, while advanced fibers are anisotropic in nature and exhibit different properties when tested along axes in different directions.

Thermal conductivity for a composite is calculated by:

$$K_x = K_L \cdot V_f \sin^2 f$$

$$K_y = K_L \cdot V_f \cos^2 f$$

$K_z$ = thermal conductivity of matrix

The benefits of a high conductivity composite heat sink are demonstrated in the following table:

MATERIAL COMPARISON

| MATERIAL | Material Longitudinal $K_L$ (W/m-k) | CTE (ppm/K) | Density (g/cc) | Specific Conductivity (W/m-k/g/cc) |
|---|---|---|---|---|
| Al 6063 | 218 | 23 | 2.7 | 81 |
| Copper | 400 | 17 | 8.9 | 45 |
| Pitch Carbon | 1000+ | −1.6 | 2.2 | 500+ |
| Composite Heat Sink | 700+ | −1.6 | 1.8 | 395+ |

When designing with isotropic metals for a specific load in a given direction, sufficient metal is required to support the load in a given direction, however excess metal will be present in directions that are not loaded as highly, resulting in a heavier, higher volume structure. A fiber reinforced composite can be designed to support the same loads; however, the fiber can be oriented in the direction of load with minimal excess fiber oriented in directions that don't have high loads, resulting in a structure with higher specific strength, thermal properties and thus weighs less and requires less volume.

Just as a high strength carbon fiber can transmit and support load along the longitudinal axis of the fiber, a high thermal conductive graphite fiber (1000+W/m-k) will transmit a thermal load along the axis of the fiber, enabling waste heat to be drawn rapidly away from the heat source and transported along a highly conductive thermal pathway created by the placement of the longitudinal fiber axis to a dissipation point, lowering thermal resistance so the structure is more thermally efficient.

The problem with employing anisotropic materials, such as high thermal conductive carbon fibers, is the lack of dissipative area available. With reference to FIG. 3, it may be seen that a simple parallelepiped heat sink 20 is composed of a plurality of fibers 22 embedded in a resin matrix 24. Even though each of fibers 22 may be highly conductive, on an order of magnitude greater than metal, the total surface area of the ends of the fibers is substantially less than the combined area of base plate 12 and fins 14 of heat sink 10. Thus, any benefit gained by the thermal conductivity of the fibers is lost due to the diminished surface area. Indeed, the loss of surface area dominates over the increase in thermal conductivity.

It may be thought that providing a composite heat sink with rectangular fins might overcome this diminished area. However, with reference to FIG. 4, it may be seen that this simply is not true. Here, heat sink 30 is formed as a base 32 with a plurality of rectangular fins 34. Again, conductive fibers 32 are embedded in a resin matrix 38. It may be seen from my comparison of FIGS. 3 and 4 that the overall radiant surface area of heat sink 30 is identical to heat sink 20. While some advantage may be gained if the resin matrix is thermally conductive, such a thermally conductive resin does not maximize the heat dissipative capacities. Thus, while the heat sink 30 of FIG. 4 would be an improvement over heat sink 20, other geometric designs according to the present invention are preferred.

One such design is shown in FIG. 5. Here, heat sink 40 is constructed to have a base 42 and a plurality of fins 44 that are each triangular in cross-section, or triangular prismoidal shaped. As is illustrated in FIG. 6, heat sink 40 again is composed of a plurality of conductive fibers 46 embedded in a resin matrix 48. The advantage of heat sink 40 can be appreciated with reference, now, to FIGS. 7 and 8 which represent cross-sections of a single fiber of the heat sink of FIG. 3 or 4 and FIGS. 5 and 6, respectively. In FIG. 7, which corresponds with either heat sink 20 or heat sink 30, it is assumed for purposes of illustration that each conductive fiber 22 (or 36) is square-shaped in cross-section and has a width "$d_1$". Accordingly, the surface area available for heat dissipation for each fiber is $d_1^2$. Thus, the heat dissipative area is $nd_1^2$ where "n" equals the number of available thermal conductive fibers.

However, with the configuration of the heat sink of FIGS. 5 and 6, it may be seen that this area is substantially increased due to the formation of the triangular fins 44. With reference now to FIG. 8, it may be seen that for each square-shaped fiber, the length of the fiber "$d_2$" is equal to "$d_1/\cos a$" where "a" is the angle at which side 50 of fin 44 is formed relative to a plane "P" that is perpendicular to the fiber direction. Accordingly, the dissipative area of each thermally conductive fiber would equal "$d_1^2/\cos a$". For the same number of fibers, which would correspond to a similarly sized base, the dissipative area equals "$nd_1^2/\cos a$" where "n" is the total number of fibers, as above. Accordingly, it should be understood by the ordinarily skilled person in this field that the heat dissipative area can be increased dramatically with the increase in the acute angle "a". Naturally, the height of the fin will increase with the sine and will be limited by the constraints of the particular application. Fins having an acute angle "a" as close to 90° as possible would maximize the dissipative area; however practical considerations may limit angle "a" to within a range of 40° to about 88°. In any event, the dissipative surface should be oblique to the longitudinal fiber direction. By "oblique" it is meant that the angle is greater than zero degrees and less than ninety degrees. Greatest dissipative area will result where the angle is as close to ninety degrees as possible within current or future materials and manufacturing constraints.

It should be appreciated that the present invention contemplates heat sinks formed from a variety of thermally anisotropic materials that transfer thermal energy more efficiently along one axis than in directions transverse thereto. For example, diamond is highly thermally conductive along the direction of molecular alignment, although economically limiting. Materials especially contemplated for use with the present invention include various carbon fiber composites available in the art, such as ones manufactured by BP Amoco (now Cytec Engineered Materials) and Mitsubishi. Such carbon fiber composites generally include thermally anisotropic fibers formed from precursors, such as polyacrilonitrile, petroleum pitch, coal pitch, synthetic pitches and the like, that have undergone various processing steps, including carbonization/graphitization in inert atmosphere and melt spinning to yield the longitudinally thermally conductive carbon fiber filaments. For example, Cytec's ThermalGraph® 6000X Panels are made entirely of oriented, pitch-based graphite fibers, with a minimum graphite volume fraction of 60%, and can be infiltrated with metals or polymers, such as a cyanate ester resin, for optimized thermal and mechanical properties. They are available in thermal conductivities ranging from 550 W/mK to 800 W/mK. Mitsubishi also provides such carbon fiber composites in its DIALEAD® coal tar pitch carbon fiber thermally conductive fibers. For example, Mitsubishi fibers K13C1U, K13C2U and K13D2U include filament diameters of 10 and 11 μm and thermal conductivities of 620 and 800 W/mK, and may be embedded in a Cytecfiberite 934 (350° F. epoxy) resin.

The carbon fiber filaments themselves may be obtained separately and used to form a desired composite by utilizing a desired support matrix, such as a polymer, including epoxy or other resin, rubber or plastic, binder pitch, or a metal such as copper or aluminum, which may be further embedded with other materials, such as graphite, copper or aluminum. For example, Cytec's Thomel®K-1100 Continuous Pitch-Based Fibers carbon fibers may be used, which have a 10 micron diameter and a longitudinal thermal conductivity of 900–1000 W/mK. Shell 828 or 826 epoxies may be used for the support matrix, optionally embedded with a conductive filler, such as a metal or graphite. Alternatively, a thermally insulating matrix, such as various polymers, may be used to permit heat transfer longitudinally along the fibers without lateral transference.

The diagrammatic representation of a forming system according to the prior art for pultruded composite materials is illustrated in FIG. 9. Here, it may be seen that pultrusion system 60 starts with a plurality of spools 62 which each feed a fiber thread 64 into a guide 66 so that a parallel ensemble 68 of threads is collimated for advancement into an impregnation bath 70. It should be understood that ensemble 68 will have a density range of 50% to 80% volume fraction of fiber. Pulling assembly 72 acts to pull ensemble 68 through the impregnation bath where the fibers 64 are embedded in a resin matrix or other support matrix as described above so as to hold them into a cohesive mass. The embedded fibers are pulled by pulling assembly 72 through a heated die 74 wherein the resin is cured into the composite bar 76. Bar 76 is then advanced into a cutting saw 78 where it is cut to desired lengths. Typically, cutting saw 78 may be a water-jet knife, diamond blade or the like, as known in the industry. Cut-off saw 78 may be computer controlled, as is known in the art. It should be appreciated that bar 76 could have any cross-section geometry, such as circular, polygonal or otherwise as known or developed in this technology.

In order to form the heat sink of FIG. 5, the cut-off saw 78 must properly cut the composite bar. Thus, as is shown in FIG. 10, bar 76 is subjected to alternate cuts in the form of a saw-tooth cut 80 and a transverse cut 82. Thus, for each transverse cut 82, a pair of heat sinks 40 are formed by virtue of the intervening saw-tooth cut 80.

With reference to FIG. 11, a first alternative geometry for the heat sink according to the present invention is illustrated. Here, heat sink 140 is formed to have a base 142 and a plurality of fins 144. Here, each of the fins 144 is triangular in cross-section and has a side 150 that is formed at angle "b" to plane "P" that is transverse to the fiber direction, as should be appreciated from the above discussion. Side 152 of each fin 144 is perpendicular to plane "P". However, since at least one of the sides of fins 144 is formed at the acute angle "b", the ordinarily skilled person will appreciate, from an understanding of basic geometry, that the surface area provided for heat dissipation by the heat sink 140 is substantially identical to that of heat sink 40. A single fin would be operable within the scope of this invention; however, by employing a plurality of fins, the overall height of the thermal transfer structure defined by the array of fins and measured in the longitudinal direction is reduced according to readily understood trigonometry.

It is possible to even further increase the surface area of a heat sink. With reference now to FIG. 12, a second alternative embodiment in the form of heat sink 240 is shown which includes a base 242 from which a plurality of truncated pins in the form of pyramids 244 project. Here, again, simple geometrical calculations can demonstrate the increase in dissipative surface area available by pyramids 244 over even the construction of heat sinks 40 and 140. As shown with reference to FIG. 12(a), such projections may be defined by a base portion 290 of a first cross-section 292, a peak portion 294 of a second cross-section 296 that is smaller than the first cross-section 292, and at least one sidewall 298 extending between base portion 290 and peak portion 294. First cross-section 292 and second cross-section 296 may be square as shown, or circular, oval, polygonal or another geometric shape, and may be different geometric shapes or geometrically congruent. It should be further understood that any shape pin, such as conical, domed or hemispherical, or with bases of any geometry, may be used within the state of the existing or developed art in order to increase the exposed fiber area. Examples of heat sinks incorporating such projections are shown with reference to FIGS. 17 (pyramidal), 18 (conical) and 19 (domed/hemispherical).

With reference to FIG. 13, it may be appreciated how the heat sink 240 is formed. Here, assuming the composite bar 76 is advanced in the "Z" direction, alternating transverse cuts 282 are alternated with an X-plane cut 280 and a Y-plane cut 281 with each of cuts 280 and 281 being a saw-tooth cut.

Turning now to FIG. 14, a cross-sectional view of a heat pipe employing the heat sink material of the present invention is illustrated to show an alternative structural application therefor. In FIG. 14, heat pipe 310 includes, for example, a cylindrical tubing 312 adapted to carry fluids or other materials at a temperature different from ambient. It should be understood that the materials could be at either a lower or higher temperature and it is desired to exchange heat from the materials and interior 314 to the outside. Accordingly, a heat sink 320 is formed as a sleeve of material having a cylindrical base portion 322 that is adapted to be in confronting intimate contact with tube 312. A plurality of radial fins 324 project radially outwardly. Since it is necessary that the fiber orientation extend radially, heat sink 320 may be formed out of a flat piece of material, such as that shown in FIGS. 5 and 12, for example. This material is then configured into the cylindrical shape around conduit 312 either in a cured or pre-cured state. Optionally, conduit 312 could be extracted to leave the formed thermal device.

Figure 15:
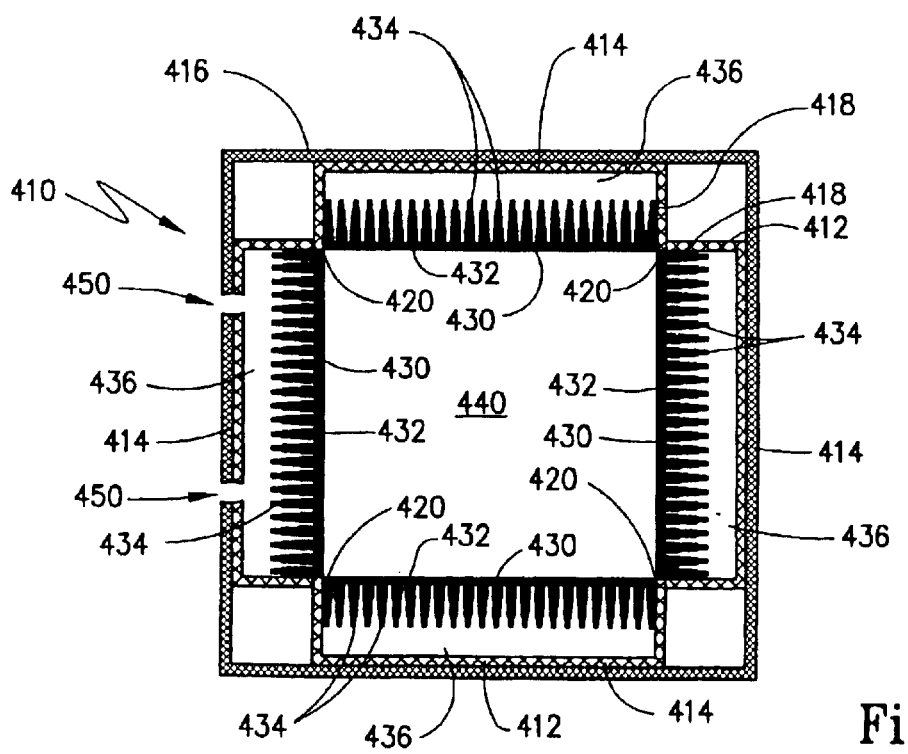
FIG. 15 is a cross-section al view of a housing for electronic equipment illustrating the use of the heat sink material of the present invention.

In FIG. 15, another alternative embodiment for the heat sink material of the present invention is shown. Here, a housing 410 for equipment is formed by a shroud 412 that may, for example, be made of fiberglass reinforced plastic. Each side of shroud 412 has side walls 414 that are in contact with and are supported by an exterior shell 416 that, in FIG. 15, is formed as a square-shaped cross-section, only for purposes of illustration. Exterior shell 416 may be a plastic material that is bonded or co-cured with shroud 412. However, it should be understood that shroud 412 and shroud 416 could be formed of different materials. Shroud 412 further has edge walls 418 that are each perpendicular to their respective wall 414 with adjacent walls 418 being joined at corners 420. Heat sinks 430 are then mounted between corners 420. Each of heat sinks 430 has a base 432 and a plurality of fins 434 which project outwardly into cavities 436. Cavities 436 are formed as the space between base 432 and a respective side wall 414.

Accordingly, an interior 440 is formed within which components, such as transformers, chokes, circuit boards, and other electrical equipment of virtually any type and variety may be mounted. Heat sinks 430 then operate to dissipate heat from the interior 440 into cavities 436. Cavities 436 can be connected to a suitable air flow, liquid cooling medium, if desired, to remove the heat from fins 434. Further, it should be understood that, in other applications, it may be desirable to form ports in shell 416 and shroud 412, such as ports 450. These ports 450 allow air circulation into regions 436. It should be understood that any variety of these techniques of a heat exchange medium could be employed with heat sinks 430 without limitation.

Figure 16:
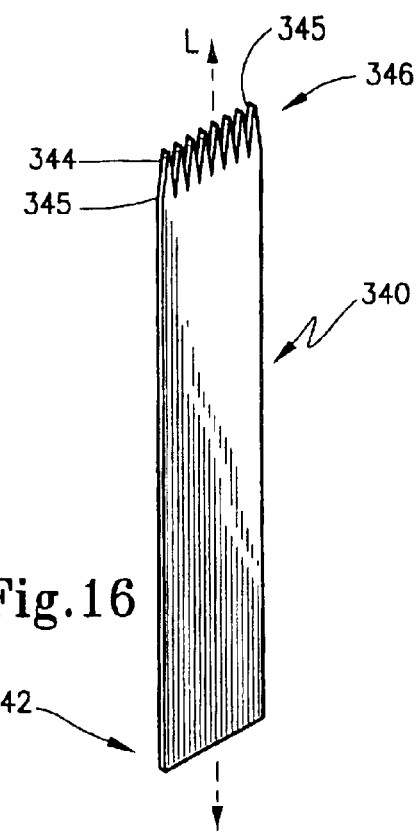
FIG. 16 is a perspective view showing a third alternative embodiment of a heat sink according to the present invention.

FIG. 16 shows a further embodiment of a heat sink 340 according to the present invention which incorporates an elongated structure to transfer heat from a first end 342 to a second end 346, which includes a plurality of projections 344 that have surfaces 345 oriented obliquely to longitudinal direction L. Heat sink 340 is formed of an anisotropic material, such as a composite carbon fiber matrix as discussed above, which efficiently transfers thermal energy along longitudinal direction L, and dissipates heat from projections 344, as discussed above.

Figure 17:
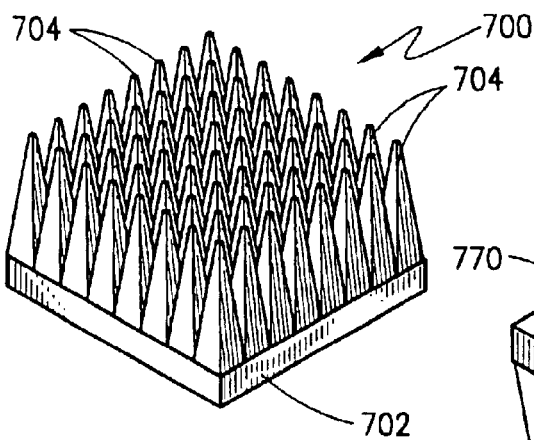
FIG. 17 is a perspective view showing a fourth alternative embodiment of a heat sink according to the present invention.
Figure 18:
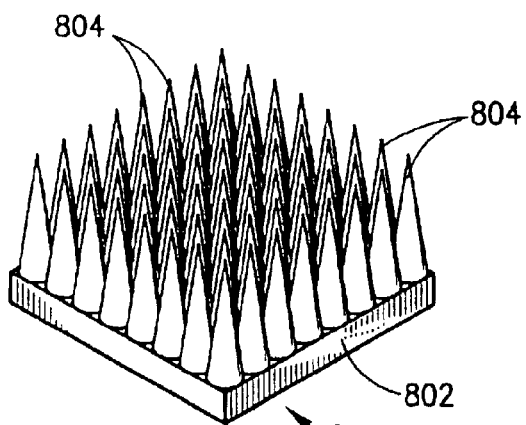
FIG. 18 is a perspective view showing a fifth alternative embodiment of a heat sink according to the present invention.
Figure 19:
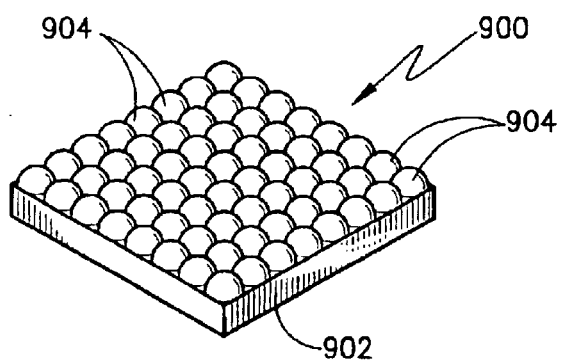
FIG. 19 is a perspective view showing a sixth alternative embodiment of a heat sink according to the present invention.

As discussed briefly above, FIGS. 17–19 show heat sinks incorporating various alternative projections. Heat sinks 700, 800 and 900 each respectively include a base 702, 802, and 902 and a plurality of projections 704, 804 and 904. Projections 704 are generally pyramidal shaped, projections 804 are generally conically shaped, and projections 904 are generally domed or hemispherically shaped. It should be appreciated from the foregoing that further modifications to the number, sizes, spacing and geometries of such projections are contemplated, as well as variations to the size and shape of the bases and the heat sinks themselves.

Figure 17A:
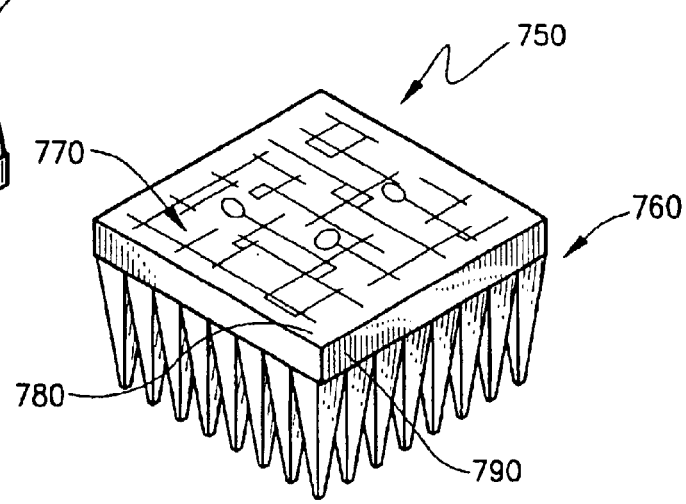
FIG. 17(a) is a perspective view of a further alternative of the fourth alternative embodiment having electrical components integrated on a surface thereof.

As also shown with respect to FIG. 17(a), the present invention contemplates thermal management devices that include electrical components integrated therein. For example, electronics board 750 comprises a heat sink 760, which here generally corresponds to heat sink 700 shown in FIG. 17, and electrical components 770 disposed on a surface thereof, In particular, electrical components 770 may be disposed on bottom surface 780 of base 790 of heat sink 760. Electrical components 770 may be formed on heat sink 760 by any known method, including various vapor deposition and etching techniques as known in the art. Heat generated by electrical components 770 while in operation is dissipated by heat sink 760 as discussed herein.

Figure 20:
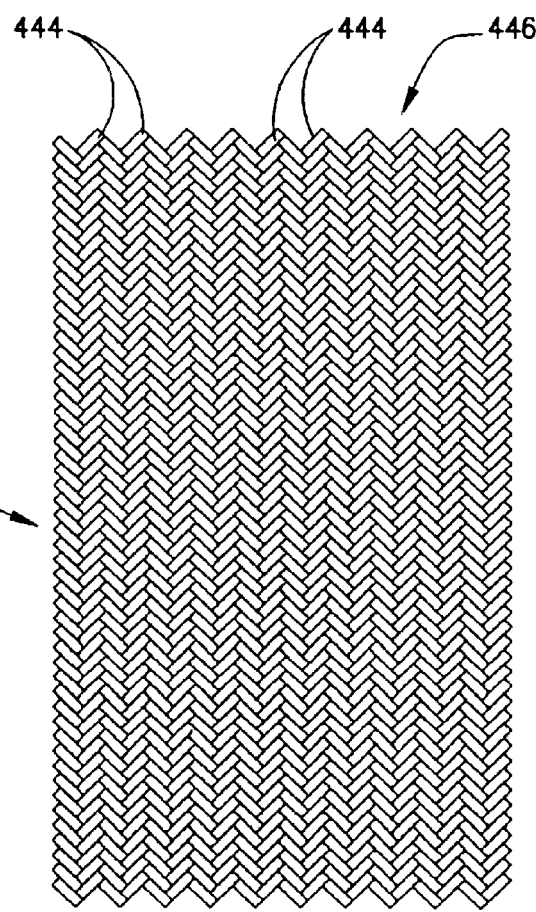
FIG. 20 is a top plan view showing a portion of a braided fiber thermal device according to the present invention.

A braided carbon fiber thermal device 440 is shown with reference to FIG. 20. Here, strands 444, each containing numerous carbon fiber filaments, are braided together in any general braiding pattern known in the art. Heat collected at a first end 442 may be transferred to second end 446 along the lengths of strands 444. Such a braided structure may be provided in any desired dimension, such as in a length and cross-section as desired, and may be used to transfer heat longitudinally along substantial distances. Such a braided structure may be quite flexible, thus allowing positioning of thermal device 440 as necessary between a desired heat collection location and heat dissipation location. It should be appreciated that thermal device 440 may be further provided with a surrounding sheath formed of a material such as rubber or the like to protect strands 444 against abrasion or wear.

Figure 21:
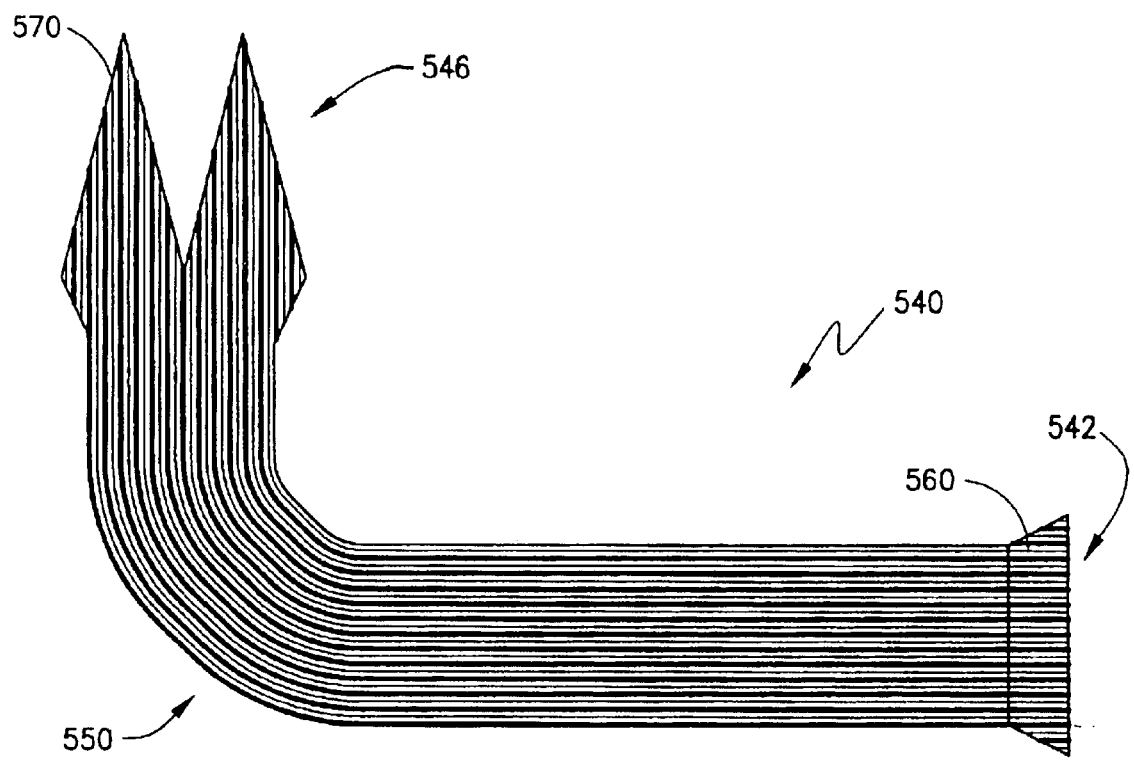
FIG. 21 is a cross-sectional side view in elevation showing a bendable thermal device according to the present invention.

A still further embodiment of a thermal device 540 according to the present invention is shown with reference to FIG. 21. Here, thermal device 540 is formed of a bendable material, such as a flexible or thermoformable material, such that body 550 of thermal device 540 can be bent at an angle as desired. The support matrix itself may be formed of a bendable or thermoformable material, such as plastic, rubber, or metal such as aluminum or copper, or the body 550 of thermal device 540 may be made flexible at selected locations therein by selectively dissolving out the support matrix material thus leaving only the flexible embedded carbon fibers. Heat may be transferred from a collecting structure 560 at first end 542 to a dissipater structure 570 at second end 546. It should be appreciated, however, that thermal devices and heat-sinks as described herein may also be oriented in a reverse orientation to that described. For example, structure 570 may be disposed in a region of heat to be dissipated, such as adjacent electrical components, and structure 560 may be placed in a cooler environment such that heat is collected at second end 546 and transferred to first end 542 to be dissipated. As such, a thermal collector structure and thermal dissipater structure as used herein should be understand to encompass any of the various shapes and geometries discussed with respect to the heat-sinks according to the present invention.

Figures 22, 23:
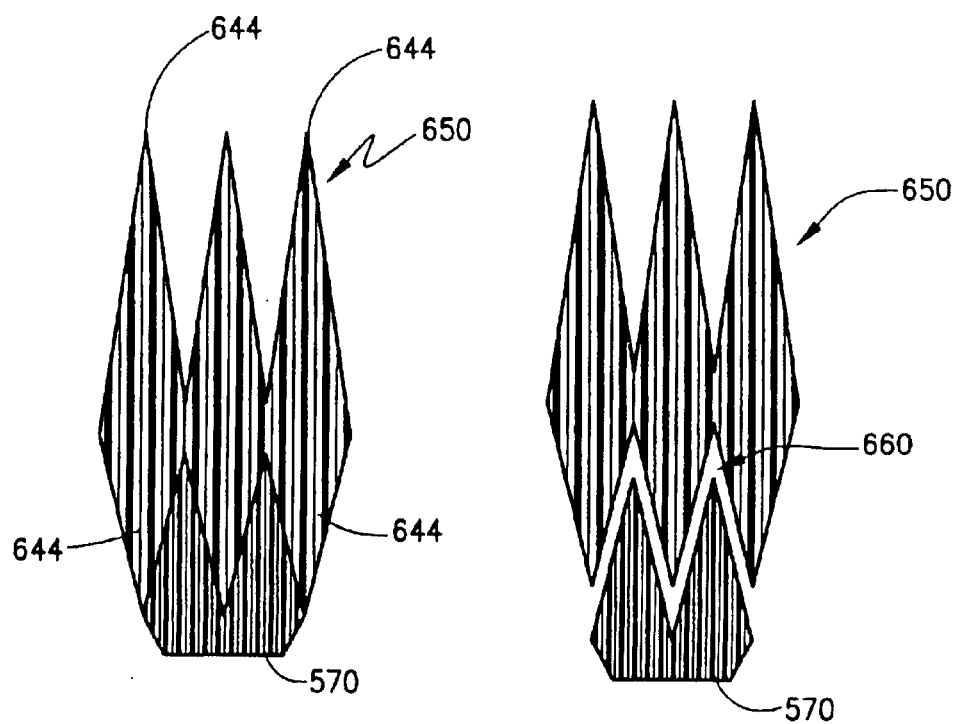
FIG. 22 is a cross-sectional side view in elevation showing a thermal coupling and regulating mechanism.
FIG. 23 is a cross-sectional side view in elevation showing the thermal coupling and regulating mechanism of FIG. 22 in a separated state.

FIGS. 22 and 23 relate to a coupling mechanism and thermal regulator using the geometries discussed herein with respect to the above-described heat sinks. Here, a coupler 650 is formed of a plurality of longitudinally extending projections 644 that are sized and adapted to engage a structure such as a dissipater structure 570 as described with respect to FIG. 21. When the ends of carbon fibers aligned in coupler 650 engage the ends of carbon fibers aligned in dissipater structure 570, heat may be transferred therebetween. As shown in Figure 23, however, coupler 650 may be moved apart from dissipater structure 570 so as to regulate the flow of thermal energy therebetween. It should be appreciated that an insulating air or other thermal regulating fluid pocket 660 of various sizes may be formed according to the degree of movement of coupler 650 from dissipater structure 570, thereby to vary the rate of energy transfer.

Accordingly, in addition to the production of basic heat sinks contemplated by this proposal, the technology has expanded application for the production of electronic boards, housing and other complex structures that incorporate integrated thermal management systems into a macro-structure to provide space and/or weight optimization and enhanced structural and environmental characteristics. A thermal component produced with high conductivity graphite fiber would have the ability to acquire and transfer more thermal heat load per area than metal; this load could be directed from the acquisition point to the dissipation points such as cooling channels or atmospheric points anywhere in the structure, on the structure or remote from the structure. For thermal management/structural systems could be achieved by hybridization of structures with high thermal conductive fiber in combination with insulative, structural and EMI/RFI shielding materials.

From the foregoing, it should also be understood that any of these heat sinks could be constructed of various different materials. While the material thought to be preferred at the present time is a carbon based filament, such as graphite, the fiber could be a boron material or other materials now known or hereinafter developed that have a thermal conductivity beyond ordinary aluminum, silver or copper. The matrix in which these fibers are then bound could be plastic, such as epoxy, polyester, nylon, etc., or, alternatively, they could be a metal matrix. This matrix could be any of those currently known or hereinafter developed. In any event, it is desirable that the matrix itself be thermally conductive, in most applications.

Finally, it should be understood that the present invention contemplates a method of producing heat sink materials of the type described above. This method would naturally entail any step that is inherent in the processing described with respect to the pultrusion and cutting process. In addition, the forming of the heat sink could be done either in a cured state or with a non-cured thermoset matrix thermal material that is formed into a desired configuration prior to curing.

Accordingly, the present invention has been described with some degree of particularity directed to the exemplary embodiments of the present invention. It should be appreciated, though, that the present invention is defined by the following claims construed in light of the prior art so that modifications or changes may be made to the exemplary embodiments of the present invention without departing from the inventive concepts contained herein.

What is claimed is:

1. A thermal device, comprising:
    (A) a thermal transfer body having first and second end portions,
        (1) wherein said thermal transfer body includes a thermally anisotropic material that conducts more thermal energy in a longitudinal direction than in a direction transverse thereto,
        (2) and wherein at least one of said first and second end portions includes a projection having a surface area oriented obliquely to said longitudinal direction.
2. A thermal device according to claim 1 wherein at least one of said first and second end portions includes a plurality of projections extending therefrom.
3. A thermal device according to claim 2 wherein said projections are similarly shaped.
4. A thermal device according to claim 2 wherein said projections generally extend in said longitudinal direction.
5. A thermal device according to claim 2 wherein each said projection includes a surface that extends in a plane oriented at an angle oblique to the longitudinal direction.
6. A thermal device according to claim 5 wherein said angle is from about 40 to about 88 degrees.
7. A thermal device according to claim 2 wherein said projections are of a shape selected from generally triangular pyismoidal shapes, generally pyramidal shapes, generally conical and generally hemispherical shapes.
8. A thermal device according to claim 1 wherein said thermally anisotropic material includes an ensemble of longitudinally thermally conductive fibers.
9. A thermal device according to claim 8 wherein said fibers are contained within a support matrix.
10. A thermal device useful in transferring heat from a heat source, comprising:
    (A) a thermal transfer body that includes an ensemble of longitudinally thermally conductive fibers extending from a first end to a second end thereof,
        (1) wherein said first end of said thermal transfer body includes a thermal collector structure adapted to be placed in thermal communication with the heat source,
        (2) wherein said second end of said thermal transfer body includes a thermal dissipater structure adapted to dissipate heat therefrom, and
        (3) wherein at least one of said thermal collector structure and said thermal dissipater structure includes exposed end surface regions of said fibers that are oriented obliquely to a longitudinal direction of said fibers.
11. A thermal device according to claim 10 wherein said longitudinally conductive fibers are carbon fibers.
12. A thermal device according to claim 11 wherein said carbon fibers are derived from a precursor selected from polyacrilonitrile, petroleum pitch, coal pitch and synthetic pitches.
13. A thermal device according to claim 10 wherein said thermal transfer body is formed of a material wherein said ensemble of longitudinally thermally conductive fibers is embedded in a support matrix.
14. A thermal device according to claim 13 wherein said support matrix is thermally conductive.
15. A thermal device according to claim 13 wherein said support matrix is thermally insulating.
16. A thermal device according to claim 13 wherein said support matrix is selected from epoxy, binder pitch, rubber, plastic, aluminum and copper.
17. A thermal device according to claim 13 wherein said material further includes an additive embedded in said support matrix, said additive being selected from a group consisting of graphite, aluminum and copper.
18. A thermal device according to claim 13 wherein said material is at least sixty percent carbon.
19. A thermal device useful in transferring heat from a heat source, comprising:
    (A) a thermal transfer body that includes an ensemble of longitudinally thermally conductive fibers extending from a first end to a second end thereof,
        (1) wherein at least one of said first end and said second end includes at least one projection defined by
            (a) a base portion of a first cross-section,
            (b) a peak portion of a second cross-section smaller than said first cross-section, and
            (c) at least one sidewall extending between said base portion and said peak portion.
20. A thermal device according to claim 19 wherein said first cross-section and said second cross-section are each a geometric shape selected from circular, oval and polygonal.
21. A thermal device according to claim 19 wherein said first cross-section and said second cross-section are different geometric shapes.
22. A thermal device according to claim 19 wherein said first cross-section and said second cross-section are geometrically congruent.
23. A thermal device according to claim 19 wherein at least one of said first end and said second end includes a plurality of said projections.
24. A thermal device according to claim 23 wherein said projections are aligned in a regular array thereof.
25. A thermal device according to claim 19 wherein said sidewall extends in a plane oriented at an angle oblique to a longitudinal direction of said fibers.
26. A thermal device according to claim 25 wherein said angle is from about 40 to about 88 degrees.
27. A thermal device according to claim 19 wherein said sidewall includes exposed end surface regions of said fibers that are oriented obliquely to a longitudinal direction of said fibers.
28. A heat sink useful in dissipating heat from a heat source, comprising a thermal transfer body that includes an ensemble of longitudinally thermally conductive fibers extending from a first end to a second end thereof, and wherein said second end of said thermal transfer body includes a thermal dissipater structure having end surface regions of at least some of said fibers exposed and oriented obliquely to a longitudinal direction of said fibers.
29. A thermal device useful in transferring heat from a heat source, comprising:
    (A) a support matrix formed of a bendable material; and
    (B) an ensemble of longitudinally extending, thermally conductive fibers formed of an anisotropic material that conducts more thermal energy in said longitudinal direction than in a direction transverse thereto, said fibers being embedded in said support matrix.
30. A thermal device according to claim 29 wherein said support matrix is flexible.
31. A thermal device according to claim 29 wherein said support matrix is thermoformable.

32. A thermal device according to claim 29 wherein said support matrix is selected from epoxy, binder pitch, rubber, plastic, aluminum and copper.

33. A thermal device useful in transferring heat from a heat source, comprising:
   (A) a thermal transfer body that includes an ensemble of longitudinally extending, thermally conductive fibers formed of an anisotropic material that conducts more thermal energy in said longitudinal direction than in a direction transverse thereto, said fibers being braided together, at least some of said fibers having end surfaces configured at an angle that is oblique to the longitudinal direction.

34. A thermal device according to claim 33 wherein said thermal transfer body is disposed within a thermally insulating sheath.

35. A thermal management device comprising:
   (A) a composite body formed by an ensemble of longitudinally thermally conducting fibers embedded in a support matrix of a first material, said composite body having
      (1) a base, and
      (2) at least one projection extending longitudinally from said base
         (a) with at least some of said fibers extending from said base in a longitudinal direction within said projection to terminate in end surfaces with at least some of the end surfaces oriented obliquely to the longitudinal direction.

36. A method of forming a thermal management device, comprising:
   (A) assembling a plurality of longitudinally thermally conducting fibers into a longitudinally extending ensemble that has a longitudinal axis; and
   (B) cutting at least some of said fibers such that at least some of said fibers have end surface regions oriented obliquely to the longitudinal axis.

37. An electrical assembly, comprising
   (A) at least one electrical component that produces heat during use; and
   (B) a heat sink in thermal communication with said electrical component, said heat sink comprising a thermal transfer body that includes an ensemble of longitudinally thermally conductive fibers extending from a first end to a second end thereof, and wherein said second end of said thermal transfer body is formed as a thermal dissipater structure having end surface regions of at least some of said fibers exposed and oriented obliquely to a longitudinal direction of said fibers.

* * * * *